(12) United States Patent
Sato et al.

(10) Patent No.: US 7,008,906 B2
(45) Date of Patent: Mar. 7, 2006

(54) OXIDE HIGH-CRITICAL TEMPERATURE SUPERCONDUCTOR ACICULAR CRYSTAL AND ITS PRODUCTION METHOD

(75) Inventors: Mitsunori Sato, Nagano (JP); Tsutomu Yamashita, Aomori (JP); Hiroshi Maeda, Ibaraki (JP); Sangjae Kim, Jeju-do (KR); Masanori Nagao, Toyama (JP)

(73) Assignee: Japan Science and Technology Agency, Kawaguchi (JP)

( * ) Notice: Subject to any disclaimer, the term of this patent is extended or adjusted under 35 U.S.C. 154(b) by 191 days.

(21) Appl. No.: 10/483,562

(22) PCT Filed: Jun. 10, 2002

(86) PCT No.: PCT/JP02/05715

§ 371 (c)(1),
(2), (4) Date: Jan. 13, 2004

(87) PCT Pub. No.: WO03/010369

PCT Pub. Date: Feb. 6, 2003

(65) Prior Publication Data

US 2004/0171493 A1 Sep. 2, 2004

(30) Foreign Application Priority Data

Jul. 25, 2001 (JP) .............................. 2001-224741

(51) Int. Cl.
*C04B 101/00* (2006.01)
*C04B 35/653* (2006.01)

(52) U.S. Cl. ...................................... 505/450; 505/729
(58) Field of Classification Search ................ 505/450, 505/729
See application file for complete search history.

(56) References Cited

FOREIGN PATENT DOCUMENTS

JP 4-65395 3/1992
JP 11-92143 4/1999

OTHER PUBLICATIONS

Nagao et al "Growth and Superconducting Properties of Bi2Sr2CaCu2O8 single-ctystal whiskers using tellurium-doped precursors", Applied Physics Letters (2001), 79(16), 2612-14 (Abstract Only).*

Ichiro Matsubara et al., Growth of superconducting whiskers in the Bi system. Journal of Crystal Growth, Mar. 1, 1993, vol. 128, Nos. 1 to 4, part 2, pp. 719 to 724 abstract; p. 722, right column, line 11 to p. 724, left column, line 16.

Ichiro Matsubara et al., Preparation and critical current density of Bi2Sr2Ca2Cu3O10+x supperconducting whiskers, Applied Physics Letters. Dec. 3, 1990, vol. 57, No. 23, pp. 2490 to 2491 abstract; p. 2490, left column, lines 26 to 41.

* cited by examiner

*Primary Examiner*—Mark Kopec
(74) *Attorney, Agent, or Firm*—Oblon, Spivak, McClelland, Maier & Neustadt, P.C.

(57) ABSTRACT

The present invention relates to a defect-free oxide high-critical temperature superconductor acicular crystal, that is, an oxide high-critical temperature superconductor acicular crystal that is substantially a perfect crystal and also relates to a method for producing the same, wherein such a crystal is essential for achieving superconducting electronic devices. The oxide high-critical temperature superconductor acicular crystal of the present invention includes an acicular crystal having a $Bi_2Sr_2Ca_2Cu_3O_{10}$ (Bi-2223) crystal structure and is grown from a powder compact by heat-treating the powder compact in an oxygen atmosphere, wherein the powder compact contains an oxide having the Bi-2223 crystal structure and $TeO_2$, $CaO$, or $(SrCa)_3TeO_6$. The achievement of the acicular crystal having the Bi-2223 crystal structure contributes to the development of superconducting electronic devices that have been theoretically proposed but have not been achieved.

3 Claims, No Drawings

OXIDE HIGH-CRITICAL TEMPERATURE SUPERCONDUCTOR ACICULAR CRYSTAL AND ITS PRODUCTION METHOD

TECHNICAL FIELD

The present invention relates to a defect-free single crystal of an oxide high-critical temperature superconductor which is essential for obtaining superconducting electronic devices, that is, an oxide high-critical temperature superconductor acicular crystal which is substantially a perfect crystal and also relates to a method for producing the same.

BACKGROUND ART

A single crystal of an oxide high-critical temperature superconductor has a crystal structure in which conductive layers and non-conductive layers are alternately stacked and the layers form an intrinsic Josephson junction. In recent years, single-crystal switching element devices using the intrinsic Josephson effect have been proposed. The single-crystal switching element devices, which are of a new type, are one-hundredth the size of known Josephson junction devices and have a switching speed that is 100 times higher than that of the known devices. The new devices are presumed to have a high operating frequency of several THz (terahertz).

In a submicron crystal element including a $Bi_2Sr_2Ca_2Cu_3O_{10}$ acicular crystal, superconducting single electron tunneling effect that a pair of electrons passes in the crystal has been currently observed. In order to achieve this effect, the element must operate at liquid helium temperature (4.2 K). When crystals in which the number of layers in a unit cell is about 1000 are used, it is presumed that superconductive single electron pair elements operating at liquid nitrogen temperature (77 K) can be achieved.

In order to achieve these elements, crystals having no defect or few defect must be used. At the present, an acicular crystal of a Bi oxide superconductor has the highest performance. The oxide superconductor has two types of crystal structure: a $Bi_2Sr_2Ca_1Cu_2O_8$ (Bi-2212) crystal structure having a superconducting critical temperature of about 85 K and a $Bi_2Sr_2Ca_2Cu_3O_{10}$ (Bi-2223) crystal structure having a superconducting critical temperature of about 110 K. In research and development, acicular crystals having the Bi-2212 crystal structure, of which the growth can be achieved, have been used. The inventors have succeeded in growing the acicular crystals having the Bi-2212 crystal structure and extremely high crystallinity using a powder compact without performing a quenching operation and amorphizing operation, wherein the powder compact has nominal composition of growing the Bi-2212 acicular crystals and contains an element for reducing the melting point. The inventors have filed a patent application for the technique (Japanese Patent Application No. 2001-38170).

For the acicular crystals, the Bi-2223 crystal structure having a superconducting critical temperature of about 110 K, which is much higher than a liquid nitrogen temperature of 77 K, is extremely advantageous in view of practical use as compared with the Bi-2212 crystal structure having a superconducting critical temperature of about 85 K. However, the acicular crystals that have been obtained only have the Bi-2212 crystal structure and the growth of acicular crystals having the Bi-2223 crystal structure have not succeeded.

DISCLOSURE OF INVENTION

As described above, a method for producing an oxide high-critical temperature superconductor acicular crystal having no defects and the $Bi_2Sr_2Ca_2Cu_3O_{10}$ (Bi-2223) crystal structure has not been established. The preparation of high-performance acicular crystals has not been also achieved.

Thus, it is a task to prepare the way for commercialization of superconducting electronic devices by developing a method for producing an oxide high-critical temperature superconductor acicular crystal having no defects and the Bi-2223 crystal structure and then preparing high-performance acicular crystals. Such devices have been theoretically proposed but have not been brought into practical use.

In view of the above situation, it is an object of the present invention to provide an oxide high-critical temperature superconductor acicular crystal having few defects and the Bi-2223 crystal structure, wherein such a crystal is essential for obtaining superconducting electronic devices. It is another object of the present invention to provide a method for producing such a crystal.

In order to achieve the above objects, the present invention provides the crystals and methods below.

(1) An oxide high-critical temperature superconductor acicular crystal includes an acicular crystal having a $Bi_2Sr_2Ca_2Cu_3O_{10}$ crystal structure, wherein the acicular crystal is grown from a powder compact by heat-treating the powder compact at a temperature of 840 to 890° C. in an atmosphere containing 5 to 100% of oxygen, and the powder compact contains one mol of an oxide having the $Bi_2Sr_2Ca_2Cu_3O_{10}$ crystal structure and 0.2 to 0.8 mol of $TeO_2$.

(2) A method for producing an oxide high-critical temperature superconductor acicular crystal includes a step of heat-treating a powder compact at 840 to 890° C. in an atmosphere containing 5 to 100% of oxygen to grow an acicular crystal having a $Bi_2Sr_2Ca_2Cu_3O_{10}$ crystal structure, wherein the powder compact contains one mol of an oxide having the $Bi_2Sr_2Ca_2Cu_3O_{10}$ crystal structure and 0.2 to 0.8 mol of $TeO_2$.

(3) An oxide high-critical temperature superconductor acicular crystal includes an acicular crystal having a $Bi_2Sr_2Ca_2Cu_3O_{10}$ crystal structure, wherein the acicular crystal is grown from a powder compact by heat-treating the powder compact at a temperature of 840 to 890° C. in an atmosphere containing 5 to 100% of oxygen, and the powder compact contains one mol of an oxide having the $Bi_2Sr_2Ca_2Cu_3O_{10}$ crystal structure, 0.2 to 0.8 mol of $TeO_2$, and 0.1 to 2.0 mol of CaO.

(4) A method for producing an oxide high-critical temperature superconductor acicular crystal includes a step of heat-treating a powder compact at 840 to 890° C. in an atmosphere containing 5 to 100% of oxygen to grow an acicular crystal having a $Bi_2Sr_2Ca_2Cu_3O_{10}$ crystal structure, wherein the powder compact contains one mol of an oxide having the $Bi_2Sr_2Ca_2Cu_3O_{10}$ crystal structure, 0.2 to 0.8 mol of $TeO_2$, and 0.1 to 2.0 mol of CaO.

(5) An oxide high-critical temperature superconductor acicular crystal includes an acicular crystal having a $Bi_2Sr_2Ca_2Cu_3O_{10}$ crystal structure, wherein the acicular crystal is grown from a powder compact by heat-treating the powder compact at a temperature of 840 to 890° C. in an atmosphere containing 5 to 100% of oxygen, and the powder compact contains one mol of an oxide having the $Bi_2Sr_2Ca_2Cu_3O_{10}$ crystal structure and 0.2 to 0.8 mol of an oxide having a $(SrCa)_3TeO_6$ crystal structure.

(6) A method for producing an oxide high-critical temperature superconductor acicular crystal includes a step of heat-treating a powder compact at 840 to 890° C. in an atmosphere containing 5 to 100% of oxygen to grow an acicular crystal having a $Bi_2Sr_2Ca_2Cu_3O_{10}$ crystal structure, wherein the powder compact contains one mol of an oxide having the $Bi_2Sr_2Ca_2Cu_3O_{10}$ crystal structure and 0.2 to 0.8 mol of an oxide having a $(SrCa)_3TeO_6$ crystal structure.

BEST MODE FOR CARRYING OUT THE INVENTION

In the present invention, the preparation of an acicular crystal has succeeded according to the following procedure: a powdery oxide high-critical temperature superconductor having a $Bi_2Sr_2Ca_2Cu_3O_{10}$ (Bi-2223) crystal structure is mixed with a powder containing $TeO_2$, CaO, and the like; the mixture is formed into powder compacts; and the powder compacts are then heat-treated in an atmosphere in which the oxygen partial pressure is varied, thereby directly preparing the acicular crystal having the Bi-2223 crystal structure using the compact.

Known acicular crystals have been grown from a calcined multiphase powder. Therefore, it has not been able to grow the acicular crystal having the Bi-2223 crystal structure.

In the present invention, the acicular crystal having the Bi-2223 crystal structure is directly grown from the compacts prepared according to the following procedure: a single phase powder having the Bi-2223 crystal structure is prepared in advance by a special method; the single phase powder is mixed with powdery $TeO_2$, powdery $TeO_2$ and CaO, or powdery $(SrCa)_3TeO_6$, which enable the acicular crystal to grow; and the mixture is formed into the powder compacts. This production method and the acicular crystal grown thereby are completely new, and the acicular crystal having a superconducting critical temperature of 110 K can be obtained.

Embodiments of the present invention will now be described in detail.

(1) Effect of Single Phase Bi-2223 Crystal Structure

Investigation has been conducted on the growth of acicular crystals having a Bi-2201 crystal structure, Bi-2212 crystal structure, or Bi-2223 crystal structure, wherein the Bi-2201 crystal structure, Bi-2212 crystal structure, and Bi-2223 crystal structure have a superconducting critical temperature of 20 K or less, about 85 K, and about 110 K, respectively. During that process, the inventors found that the crystal structure of the acicular crystals depends on the crystal structure of powder compacts, namely, host phases. In order to obtain a defect-free, single-phase acicular crystal having the Bi-2223 crystal structure, the acicular crystal must be grown from a single-phase powder compact, namely, a host phase, having the Bi-2223 crystal structure.

(2) Effects of Addition of $TeO_2$ and Addition of Both $TeO_2$ and CaO

The growth of acicular crystals is promoted in proportion to a difference between the melting point of an oxide high-critical temperature superconductor and that of a host phase having nominal composition. Therefore, it is extremely effective that the composition contains $TeO_2$, which reduces the melting point of the host phase. An acicular crystal having the Bi-2223 crystal structure is grown from a mixture containing one mol of the oxide $Bi_2Sr_2Ca_2Cu_3O_{10}$ and 0.2–0.8 mol of $TeO_2$. When the $TeO_2$ content is about 0.5 mol, the optimum effect can be achieved. The obtained acicular crystal does not contain Te.

When the host phase contains both $TeO_2$ and CaO, the host phase has low melting point, thereby promoting the growth of the acicular crystal. When the host phase contains $TeO_2$ only or both $TeO_2$ and CaO, the host phase has a $(SrCa)_3TeO_6$ crystal structure.

(3) Effect of Addition of $(SrCa)_3TeO_6$

In order to grow the acicular crystal having the Bi-2223 crystal structure, the diffusional driving force for growing the acicular crystal in the host phase is necessary. $(SrCa)_3TeO_6$ contained in the host phase has the driving force. The acicular crystal is grown in a powder compact containing one mol of an oxide having a $Bi_2Sr_2Ca_2Cu_3O_{10}$ crystal structure and 0.2–0.8 mol of an oxide having a $(SrCa)_3TeO_6$ crystal structure. When the $(SrCa)_3TeO_6$ content is about 0.5 mol, the optimum effect can be achieved.

(4) Effect of Temperature and Atmosphere of Heat Treatment

In order to grow acicular crystals, the temperature and atmosphere of heat treatment must be optimized. The acicular crystal having the Bi-2223 crystal structure is grown at 840–890° C. in an atmosphere containing 5–100% of oxygen during the heat treatment. The optimum conditions are as follows: the heat-treating temperature is 860° C. and the oxygen content in the atmosphere is 10%.

EXAMPLES (1) Effect of Single Phase Bi-2223 Crystal Structure

A powder with nominal composition for Bi-2223 was prepared by a chemical coprecipitation method. A powder compact prepared using the powder was heat-treated at 845–850° C. for 100 hours in an atmosphere containing 20% of $O_2$, thereby obtaining a single phase pellet having a Bi-2223 crystal structure. The pellet was crashed in anhydrous alcohol with a ball mill so as to avoid the hydrolysis of the pellet, thereby preparing a single phase powder having the Bi-2223 crystal structure. In order to render the Bi-2223 crystal structure to be a single phase, the powder must have nominal composition represented by $(BiPb)_2Sr_2Ca_2Cu_3O_{10}$ in which part of Bi is replaced with Pb.

As is generally known, the nominal composition is represented by $Bi_{1.6-1.8}Pb_{0.3-0.4}Sr_{1.9}Ca_{2.1}Cu_{3.0}O_x$ in particular On the other hand, a calcined multiphase powder with substantially the same nominal composition as the above was prepared, wherein the powder had the Bi-2212 crystal structure containing $Ca_2CuO_3$, $Ca_2PbO_4$, and the like. These powders were mixed with $TeO_2$ and CaO in such a manner that the ratio of an oxide having a $Bi_2Sr_2Ca_2Cu_3O_{10}$ crystal structure to $TeO_2$ to CaO is 1:0.5:1.0 on a mole basis, the mixtures were calcined at 820° C. for 10 hours, and the resulting mixtures were then formed into powder compacts having a diameter $\phi$ of 15 mm and a thickness of 2 mm.

The powder compacts were heat-treated at 860° C. for 100 hours in an atmosphere containing 10% of oxygen, thereby growing acicular crystals from the respective powder compacts. Table 1 shows the crystal structure of the powder compacts, namely, host phases, and the crystal structure of the acicular crystals.

TABLE 1

| | Crystal Structure of Host Phase | Crystal Structure of Acicular Crystal |
|---|---|---|
| Calcined Powder Having Nominal Composition for Forming Bi-2223 Crystal Structure | Bi-2212 + $Ca_2CuO_3$ + $Ca_2PbO_4$, and the like ($TeO_2$ + CaO) | Bi-2212 |
| Powder Having Bi-2223 Crystal Structure | Bi-2223 ($TeO_2$ + CaO) | Bi-2223 |

The acicular crystal having the Bi-2212 crystal structure is grown from the host phase having the Bi-2212 crystal structure, and the acicular crystal having the Bi-2223 crystal structure is grown from the host phase having the Bi-2223 crystal structure. That is, the crystal structure of an acicular crystal depends on the crystal structure of a superconductor in a host phase. The single-phase acicular crystal having the Bi-2223 crystal structure can be grown only from the powder compact in which the host phase has the Bi-2223 crystal structure.

(2) Effects of Addition of $TeO_2$ and Addition of Both $TeO_2$ and CaO

An oxide having a $Bi_2Sr_2Ca_2Cu_3O_{10}$ crystal structure was mixed with $TeO_2$ or both $TeO_2$ and CaO, thereby preparing mixed powders having different compositions. The powders were calcined at 820° C. for 10 hours and then formed into powder compacts having a diameter ϕ of 15 mm and a thickness of 2 mm. The powder compacts were heat-treated at 860° C. for 100 hours in an atmosphere containing 10% of oxygen, thereby growing acicular crystals from the respective powder compacts. Table 2 shows the length of the acicular crystals, obtained by varying the content of $TeO_2$ or the content of both $TeO_2$ and CaO, having the Bi-2223 crystal structure.

TABLE 2

| $TeO_2$ (mol) | CaO (mol) | Length of Acicular Crystal (mm) |
|---|---|---|
| 0 | 0 | 0 |
| 0.2 | 0 | 1~2 |
| 0.5 | 0 | 6~8 |
| 0.8 | 0 | 1~3 |
| 0.5 | 0.1 | 6~9 |
| 0.5 | 0.5 | 7~10 |
| 0.5 | 1.0 | 9~12 |
| 0.5 | 1.5 | 8~10 |
| 0.5 | 2.0 | 3~5 |

The acicular crystals having the Bi-2223 crystal structure are grown from the powder compacts containing one mol of the oxide $Bi_2Sr_2Ca_2Cu_3O_{10}$ and 0.2–0.8 mol of $TeO_2$. When the $TeO_2$ content is about 0.5 mol, the optimum effect can be achieved and the crystal length is 6–8 mm. For a combination of $TeO_2$ and CaO, the acicular crystals are grown from the powder compacts having a CaO content of 0.1–2.0 mol when the $TeO_2$ content is 0.5 mol which is the most effective value. When the CaO content is about 1.0 mol, the optimum effect can be achieved and the crystal length is 9–12 mm. The growth of the acicular crystals is promoted due to the addition of both $TeO_2$ and CaO.

For the powder compacts containing no Te, the growth of the acicular crystals is not observed. The obtained acicular crystals do not contain Te.

For both the powder compacts containing $TeO_2$ and the powder compacts containing both $TeO_2$ and CaO, the host phases have the $(SrCa)_3TeO_6$ crystal structure.

(3) Effect of Addition of $(SrCa)_3TeO_6$

An oxide having a $Bi_2Sr_2Ca_2Cu_3O_{10}$ crystal structure was mixed with $(SrCa)_3TeO_6$ thereby preparing mixed powders having different compositions. The powders were calcined at 820° C. for 10 hours and then formed into powder compacts having a diameter ϕ of 15 mm and a thickness of 2 mm. The powder compacts were heat-treated at 870° C. for 100 hours in an atmosphere containing 10% of oxygen, thereby growing acicular crystals from the respective powder compacts. Table 3 shows the length of the acicular crystals, obtained by varying the content of $(SrCa)_3TeO_6$, having the Bi-2223 crystal structure.

TABLE 3

| $(SrCa)_3TeO_6$ (mol) | Length of Acicular Crystal (mm) |
|---|---|
| 0.2 | 1~2 |
| 0.5 | 5~7 |
| 0.8 | 1~2 |

The acicular crystals having the Bi-2223 crystal structure are grown from the powder compacts containing one mol of the oxide $Bi_2Sr_2Ca_2Cu_3O_{10}$ and 0.2–0.8 mol of $(SrCa)_3TeO_6$. When the $(SrCa)_3TeO_6$ content is about 0.5 mol, the optimum effect can be achieved and the crystal length is 5–7 mm. The obtained acicular crystals do not contain Te.

(4) Effect of Temperature and Atmosphere of Heat Treatment

One mol of an oxide having a $Bi_2Sr_2Ca_2Cu_3O_{10}$ crystal structure was mixed with 0.5 mol of $TeO_2$ and 1.0 mol of CaO, thereby preparing a mixed powder. The powder was calcined at 820° C. for 10 hours and then formed into powder compacts having a diameter ϕ of 15 mm and a thickness of 2 mm. The powder compacts were heat-treated at different temperatures for 100 hours in atmospheres having different oxygen percentages, thereby growing acicular crystals from the respective powder compacts. The oxygen content was controlled by adding argon. Table 4 shows the length of the acicular crystals, obtained by varying the heat-treating temperature and oxygen content, having the Bi-2223 crystal structure.

TABLE 4

| Heat Treating Temperature (° C.) | Oxygen Content (%) | Length of Acicular Crystal (mm) |
|---|---|---|
| 840 | 10 | 1~2 |
| 860 | 10 | 9~12 |
| 880 | 10 | 6~8 |
| 890 | 10 | 2~3 |
| 860 | 5 | 4~6 |
| 860 | 20 | 7~9 |
| 860 | 100 | 2~4 |

The acicular crystals having the Bi-2223 crystal structure are grown from the powder compacts heat-treated at 840–890° C., in an atmosphere containing 10% of oxygen. When the temperature is 860° C., the crystal length is 9–12 mm. The acicular crystals are grown from the powder compacts treated in an atmosphere containing 5 to 100% of oxygen when the heat-treating temperature is 860° C. which is most effective in the growth. When the oxygen content is 10%, the crystal length is 9–12 mm. Thus, the optimum conditions of the heat treatment are as follows: the temperature is 860° C. and the oxygen content in the atmosphere is 10%.

The obtained acicular crystals were examined with an X-ray diffractometer, electron probe microanalyzer, and energy dispersive spectrometer. All the acicular crystals consisted of a single crystal of a Bi-2223 phase and did not contain the element Te that lowers the melting point of host phases.

The present invention is not limited to the above embodiments, and various modifications may be performed within a scope of the present invention. The invention is intended to cover such modifications.

As described above in detail, according to the present invention, the following advantages can be achieved.
(A) A method for producing a defect-free acicular crystal having a Bi-2223 crystal structure is established, thereby obtaining high-quality acicular crystals.
(B) The achievement of the acicular crystal having the Bi-2223 crystal structure contributes to the development of superconducting electronic elements that have been theoretically proposed but have not been achieved. Thereby, switching elements operating at high speed and high frequencies that have not been used can be achieved and information technology is strongly stimulated.

INDUSTRIAL APPLICABILITY

The present invention relates to an oxide high-critical temperature superconductor acicular crystal that is substantially a perfect crystal and also relates to a method for producing the same. Such a crystal is fit for superconducting devices having a high operating frequency of several THz.

The invention claimed is:

1. A method for producing an oxide high-critical temperature superconductor acicular crystal, comprising a step of heat-treating a powder compact at 840 to 890° C. in an atmosphere containing 5 to 100% of oxygen to grow an acicular crystal having a $Bi_2Sr_2Ca_2Cu_3O_{10}$ crystal structure, wherein the powder compact contains one mol of an oxide having the $Bi_2Sr_2Ca_2Cu_3O_{10}$ crystal structure and 0.2 to 0.8 mol of $TeO_2$.

2. A method for producing an oxide high-critical temperature superconductor acicular crystal, comprising a step of heat-treating a powder compact at 840 to 890° C. in an atmosphere containing 5 to 100% of oxygen to grow an acicular crystal having a $Bi_2Sr_2Ca_2Cu_3O_{10}$ crystal structure, wherein the powder compact contains one mol of an oxide having the $Bi_2Sr_2Ca_2Cu_3O_{10}$ crystal structure, 0.2 to 0.8 mol of $TeO_2$, and 0.1 to 2.0 mol of CaO.

3. A method for producing an oxide high-critical temperature superconductor acicular crystal, comprising a step of heat-treating a powder compact at 840 to 890° C. in an atmosphere containing 5 to 100% of oxygen to grow an acicular crystal having a $Bi_2Sr_2Ca_2Cu_3O_{10}$ crystal structure, wherein the powder compact contains one mol of an oxide having the $Bi_2Sr_2Ca_2Cu_3O_{10}$ crystal structure and 0.2 to 0.8 mol of an oxide having a $(SrCa)_3TeO_6$ crystal structure.

* * * * *